(12) United States Patent
Sugita

(10) Patent No.: US 12,198,954 B2
(45) Date of Patent: Jan. 14, 2025

(54) EXECUTION DEVICE AND EXECUTION METHOD

(71) Applicant: Tokyo Electron Limited, Tokyo (JP)

(72) Inventor: Kippei Sugita, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 700 days.

(21) Appl. No.: 17/335,475

(22) Filed: Jun. 1, 2021

(65) Prior Publication Data

US 2021/0391195 A1    Dec. 16, 2021

(30) Foreign Application Priority Data

Jun. 15, 2020 (JP) ................................. 2020-103004

(51) Int. Cl.
| | |
|---|---|
| *H01L 21/67* | (2006.01) |
| *G01P 15/18* | (2013.01) |
| *H01L 21/66* | (2006.01) |
| *G06T 7/00* | (2017.01) |

(52) U.S. Cl.
CPC ........ *H01L 21/67259* (2013.01); *G01P 15/18* (2013.01); *H01L 22/12* (2013.01); *H01L 22/14* (2013.01); *G06T 7/0004* (2013.01); *H01L 21/67184* (2013.01)

(58) Field of Classification Search
CPC .... G01P 15/18; G01P 15/0891; G06T 7/0004; H01L 21/67259; H01L 22/12; H01L 22/14; H01L 21/67184; H01L 21/67248; H01L 21/67253
See application file for complete search history.

(56) References Cited

U.S. PATENT DOCUMENTS

| | | | |
|---|---|---|---|
| 2008/0102200 A1 | 5/2008 | Doki et al. | |
| 2009/0033908 A1* | 2/2009 | Matsumoto | ....... H01L 21/67259 374/E1.001 |
| 2015/0176980 A1 | 6/2015 | Jensen et al. | |

FOREIGN PATENT DOCUMENTS

| | | | |
|---|---|---|---|
| CN | 102751210 B | * | 2/2015 |
| JP | H08-078315 A | | 3/1996 |
| JP | 2014216441 A | * | 11/2014 |
| JP | 2017-183683 A | | 10/2017 |
| KR | 10-2017-0113262 A | | 10/2017 |

OTHER PUBLICATIONS

Yuto Usuki et al., U.S. Appl. No. 17/469,513, filed Sep. 8, 2021, which corresponds to U.S. Appl. No. 17/335,475.

* cited by examiner

*Primary Examiner* — Tri T Ton
(74) *Attorney, Agent, or Firm* — Studebaker & Brackett PC

(57) ABSTRACT

An execution device according to exemplary embodiments includes an operation device, a first acceleration sensor, a second acceleration sensor, and a control device. The operation device executes a predetermined operation. The first acceleration sensor detects acceleration in a first direction along a horizontal direction. The second acceleration sensor detects acceleration in a second direction intersecting the first direction along the horizontal direction. The control device recognizes a transport position of the execution device in the semiconductor manufacturing apparatus based on output values from the first acceleration sensor and the second acceleration sensor. When it is recognized that the execution device is transported to a predetermined position, the control device causes the operation device to execute the predetermined operation.

16 Claims, 10 Drawing Sheets

Fig.9

| | TRANSPORT STEP | | | | | | |
|---|---|---|---|---|---|---|---|
| | 1 | 2 | 3 | 4 | 5 | 6 | |
| REQUIRED TIME | SET TIME | SET TIME | SET TIME | SET TIME | SET TIME | SET TIME | |
| MAXIMUM ACCELERATION | >ARBITRARY | >ARBITRARY | >ARBITRARY | >ARBITRARY | >ARBITRARY | >ARBITRARY | R |
| MINIMUM ACCELERATION | <ARBITRARY | <ARBITRARY | <ARBITRARY | <ARBITRARY | <ARBITRARY | <ARBITRARY | |
| OPERATION | FIRST OPERATION | SECOND OPERATION | THIRD OPERATION | FOURTH OPERATION | FIFTH OPERATION | SIXTH OPERATION | |

EXECUTION DEVICE AND EXECUTION METHOD

TECHNICAL FIELD

This application is based on and claims the benefit of priority from Japanese Patent Application No. 2020-103004 filed on Jun. 15, 2020 the entire contents of which is incorporated herein by reference.

Exemplary embodiments of the present disclosure relate to an execution device and an execution method.

BACKGROUND

Japanese Unexamined Patent Publication No. 2017-183683 discloses a measuring instrument that executes an operation for measuring electrostatic capacitance. This measuring instrument includes a base board, a first sensor, a second sensor, and a circuit board. The first sensor includes a first electrode provided along an edge of the base board. The second sensor includes a second electrode fixed on the base board. The circuit board is mounted on the base board and is connected to the first sensor and the second sensor. The circuit board gives a high frequency signal to the first electrode and the second electrode, acquires a first measured value according to an electrostatic capacitance from a voltage amplitude at the first electrode, and acquires a second measured value according to the electrostatic capacitance from the voltage amplitude at the second electrode.

SUMMARY

In an exemplary embodiment, an execution device is provided, which is transported to a transport device provided in a semiconductor manufacturing apparatus and executes a predetermined operation. The execution device includes an operation device, a first acceleration sensor, a second acceleration sensor, and a control device. The operation device is a device for executing a predetermined operation. The first acceleration sensor detects acceleration in a first direction along a horizontal direction. The second acceleration sensor detects acceleration in a second direction intersecting the first direction along the horizontal direction. The control device recognizes a transport position of the execution device in the semiconductor manufacturing apparatus based on output values from the first acceleration sensor and the second acceleration sensor. When it is recognized that the execution device is transported to a predetermined position, the control device causes the operation device to execute the predetermined operation.

BRIEF DESCRIPTION OF THE DRAWINGS

FIG. 9 is an example of a transport recipe used in an example of the execution device.

DETAILED DESCRIPTION

Figure 1:
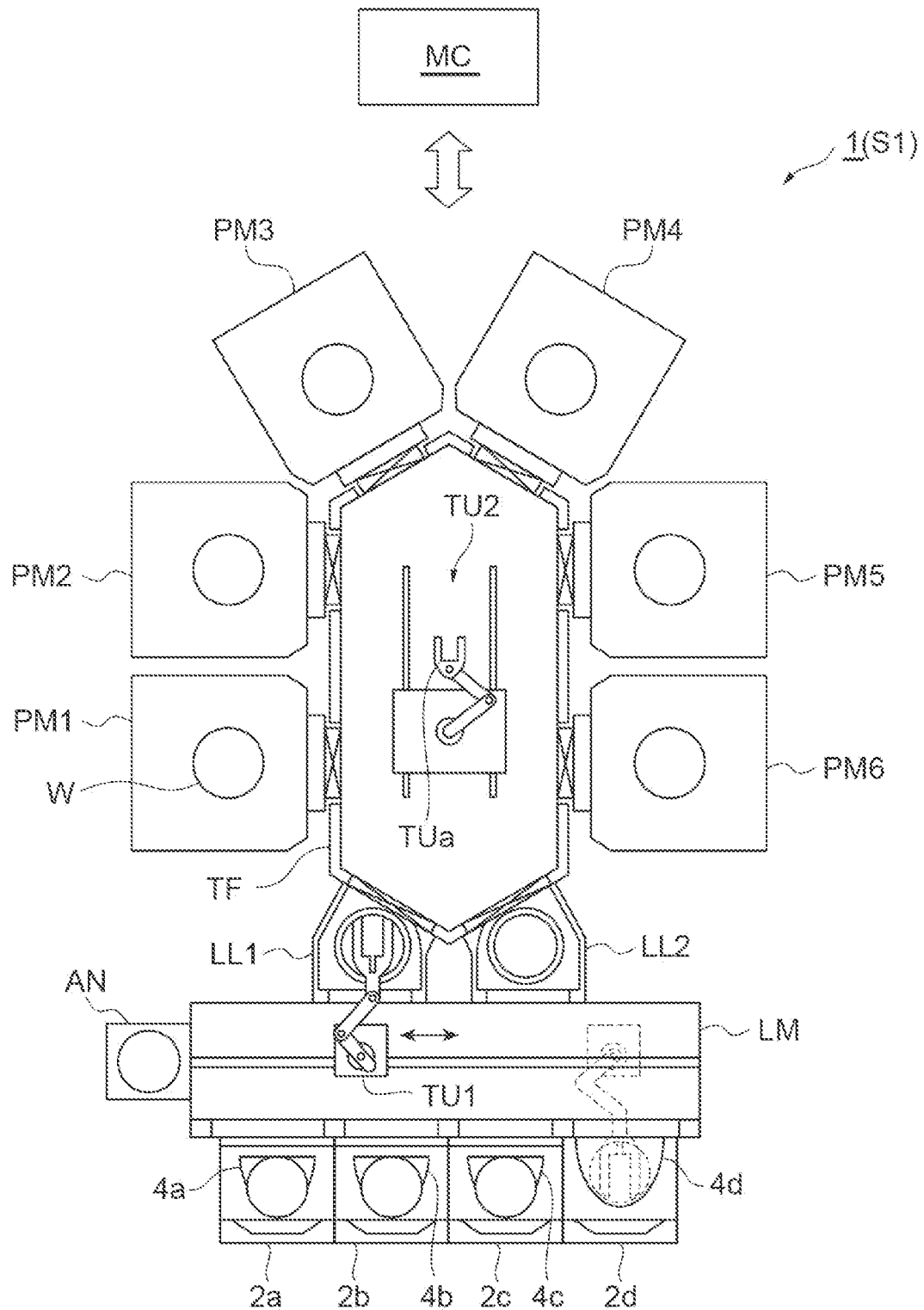
FIG. 1 is a diagram illustrating a processing system.

Hereinafter, various exemplary embodiments will be described.

In an exemplary embodiment, an execution device is provided, which is transported to a transport device provided in a semiconductor manufacturing apparatus and executes a predetermined operation. The execution device includes an operation device, a first acceleration sensor, a second acceleration sensor, and a control device. The operation device is a device for executing a predetermined operation. The first acceleration sensor detects acceleration in a first direction along a horizontal direction. The second acceleration sensor detects acceleration in a second direction intersecting the first direction along the horizontal direction. The control device recognizes a transport position of the execution device in the semiconductor manufacturing apparatus based on output values from the first acceleration sensor and the second acceleration sensor. When it is recognized that the execution device is transported to a predetermined position, the control device causes the operation device to execute the predetermined operation.

In the execution device in the embodiment described above, the horizontal acceleration applied to the execution device is detected by the first acceleration sensor and the second acceleration sensor provided in the execution device. Therefore, the transport position of the execution device can be recognized by specifying a transport state based on the output values from the first acceleration sensor and the second acceleration sensor. By controlling the operation device to execute the predetermined operation when it is recognized that the execution device is transported to a predetermined position, the predetermined operation can be automatically executed at the desired position.

In an exemplary embodiment, the control device may store recipe information indicating a relationship between information on the acceleration applied to the execution device transported to the transport device and information on the transport position. The control device may recognize the transport position from the acceleration derived based on the output values from the first acceleration sensor and the second acceleration sensor with reference to the recipe information.

In an exemplary embodiment, the operation device may include a plurality of light sources that emit light having wavelengths different from each other, and the predetermined operation may be a light emission from the plurality of light sources.

In another exemplary embodiment, an execution method for causing an execution device transported to a transport device provided in a semiconductor manufacturing apparatus to execute a predetermined operation, is provided. This method includes acquiring acceleration of the execution device in a first direction along the horizontal direction and a second direction intersecting the first direction along a horizontal direction. This method includes recognizing a transport position of the execution device in the semiconductor manufacturing apparatus based on the acceleration. This method includes causing the execution device to execute the predetermined operation when it is recognized that the execution device is transported to a predetermined position.

In an exemplary embodiment, the recognizing of the transport position may include referring to recipe information indicating a relationship between information on the acceleration applied to the execution device transported to the transport device and information on the transport position.

In an exemplary embodiment, the executing of the predetermined operation may include emitting light having wavelengths different from each other by a plurality of light sources.

Hereinafter, various embodiments will be described in detail with reference to the drawings. The same reference numerals will be given to the same or corresponding parts in each drawing.

The execution device according to one exemplary embodiment can be transported by a processing system 1 that has a function as a semiconductor manufacturing apparatus S1. First, a processing system that includes a processing device for processing the workpiece and a transport device for transporting the workpiece to the processing device will be described. FIG. 1 is a diagram illustrating a processing system. The processing system 1 includes tables 2a to 2d, containers 4a to 4d, a loader module LM, an aligner AN, a load lock modules LL1 and LL2, a process modules PM1 to PM6, a transfer module TF, and a controller MC. The number of tables 2a to 2d, the number of containers 4a to 4d, the number of load lock modules LL1 and LL2, and the number of process modules PM1 to PM6 are not limited, and any number of equal to or greater than one can be used.

The tables 2a to 2d are arranged along one edge of the loader module LM. The containers 4a to 4d are mounted on the tables 2a to 2d, respectively. Each of the containers 4a to 4d is, for example, a container called a front opening unified pod (FOUP). Each of the containers 4a-4d can be configured to accommodate the workpiece W. The workpiece W has a substantially disk shape like a wafer.

Inside of the loader module LM, there is a chamber wall that defines a transport space under atmospheric pressure. A transport device TU1 is provided in this transport space. The transport device TU1 is, for example, an articulated robot and is controlled by the controller MC. The transport device TU1 is configured to transport the workpiece W between the containers 4a to 4d and the aligner AN, between the aligner AN and the load lock modules LL1 to LL2, and between the load lock modules LL1 to LL2 and the containers 4a to 4d.

Figure 2:
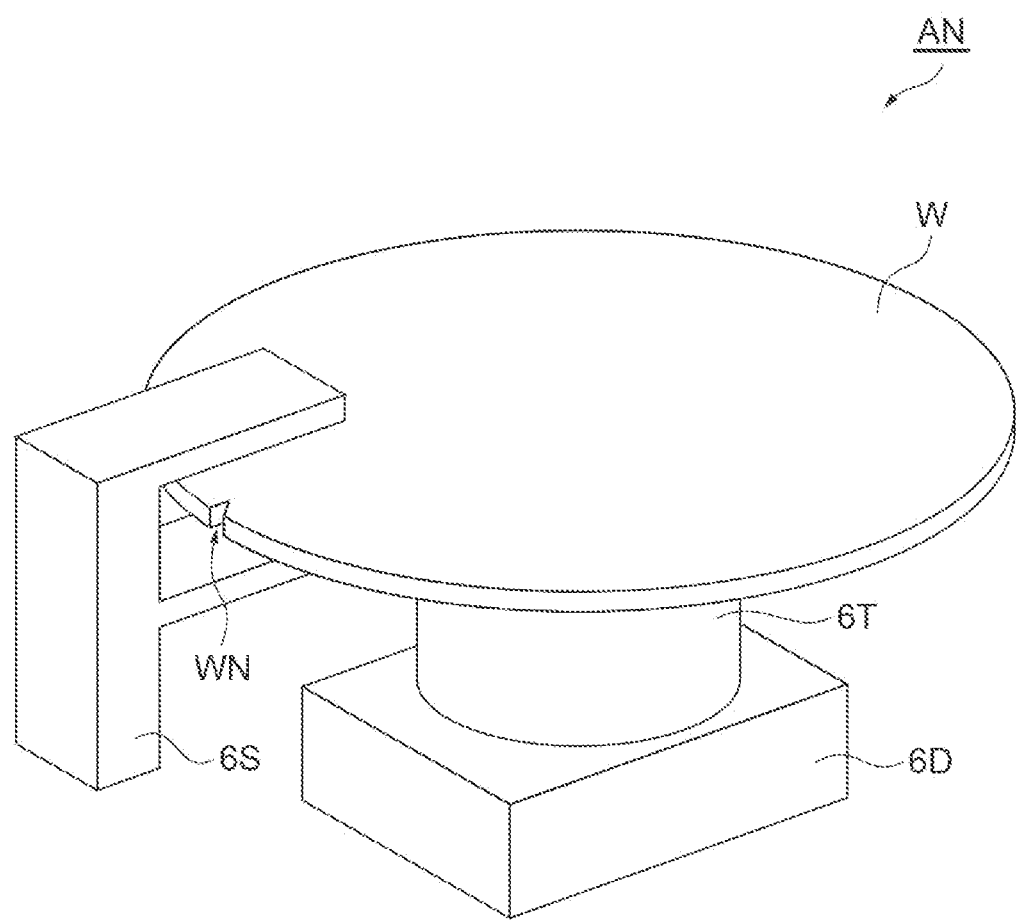
FIG. 2 is a perspective view illustrating an aligner.

The aligner AN is connected to the loader module LM. The aligner AN is configured to adjust the position of the workpiece W (calibrate the position). FIG. 2 is a perspective view illustrating an aligner. The aligner AN includes a support stand 6T, a drive device 6D, and a sensor 6S. The support stand 6T is a stand that can rotate around the axis extending in the vertical direction. The support stand 6T is configured to support the workpiece W. The support stand 6T is rotated by the drive device 6D. The drive device 6D is controlled by the controller MC. When the support stand 6T is rotated due to the power from the drive device 6D, the workpiece W placed on the support stand 6T is also rotated.

The sensor 6S is an optical sensor. The sensor 6S detects the edge of the workpiece W while the workpiece W is rotated. From the result of detecting the edge, the sensor 6S detects an amount of deviation of an angle position of a notch WN (or another marker) of the workpiece W with respect to a reference angle position and an amount of deviation of a center position of the workpiece W with respect to the reference position. The sensor 6S outputs the amount of deviation of the angle position of the notch WN and the amount of deviation of the center position of the workpiece W to the controller MC. The controller MC calculates an amount of rotation of the support stand 6T for correcting the angle position of the notch WN to the reference angle position based on the amount of deviation of the angle position of the notch WN. The controller MC controls the drive device 6D to rotate the support stand 6T as much as the amount of rotation. In this way, the angle position of the notch WN can be corrected to the reference angle position. In addition, the controller MC controls a position of an end effector of the transport device TU1 when receiving the workpiece W from the aligner AN based on the amount of deviation of the center position of the workpiece W. In this way, the center position of the workpiece W matches the predetermined position on the end effector of the transport device TU1.

Returning to FIG. 1, each of the load lock module LL1 and the load lock module LL2 is provided between the loader module LM and the transfer module TF. Each of the load lock module LL1 and the load lock module LL2 provides a preliminary decompression chamber.

The transfer module TF is airtightly connected to the load lock module LL1 and the load lock module LL2 via a gate valve. The transfer module TF provides a decompression chamber capable of decompression. A transport device TU2 is provided in this decompression chamber. The transport device TU2 is, for example, an articulated robot having a transport arm TUa. The transport device TU2 is controlled by the controller MC. The transport device TU2 is configured to transport the workpiece W between the load lock modules LL1 to LL2 and the process modules PM1 to PM6, and between any two process modules of the process modules PM1 to PM6.

The process modules PM1 to PM6 are airtightly connected to the transfer module TF via the gate valve. Each of the process modules PM1 to PM6 is a processing device configured to perform a dedicated process such as plasma processing on the workpiece W.

A series of operations when the processing on the workpiece W is performed in the processing system 1 will be illustrated as follows. The transport device TU1 of the loader module LM takes out the workpiece W from any of the containers 4a to 4d and transports the workpiece W to the aligner AN. Subsequently, the transport device TU1 takes out the position adjusted workpiece W from the aligner AN, and transports the workpiece W to one of the load lock module LL1 and the load lock module LL2. Next, one load lock module reduces the pressure in the preliminary decompression chamber to a predetermined pressure. Next, the transport device TU2 of the transfer module TF takes out the workpiece W from one of the load lock modules and transports the workpiece W to any of the process modules PM1 to PM6. Then, one or more process modules among the process modules PM1 to PM6 performs processing on the workpiece W. Then, the transport device TU2 transports the processed workpiece W from the process module to one of the load lock module LL1 and the load lock module LL2. Next, the transport device TU1 transports the workpiece W from one of the load lock modules to any of the containers 4a to 4d.

This processing system 1 includes the controller MC as described above. The controller MC can be a computer including a processor, a storage device such as a memory, a display device, an input/output device, a communication device, and the like. The series of operations of the processing system 1 described above are realized by controlling each part of the processing system 1 by the controller MC according to the program stored in the storage device.

Figure 3:
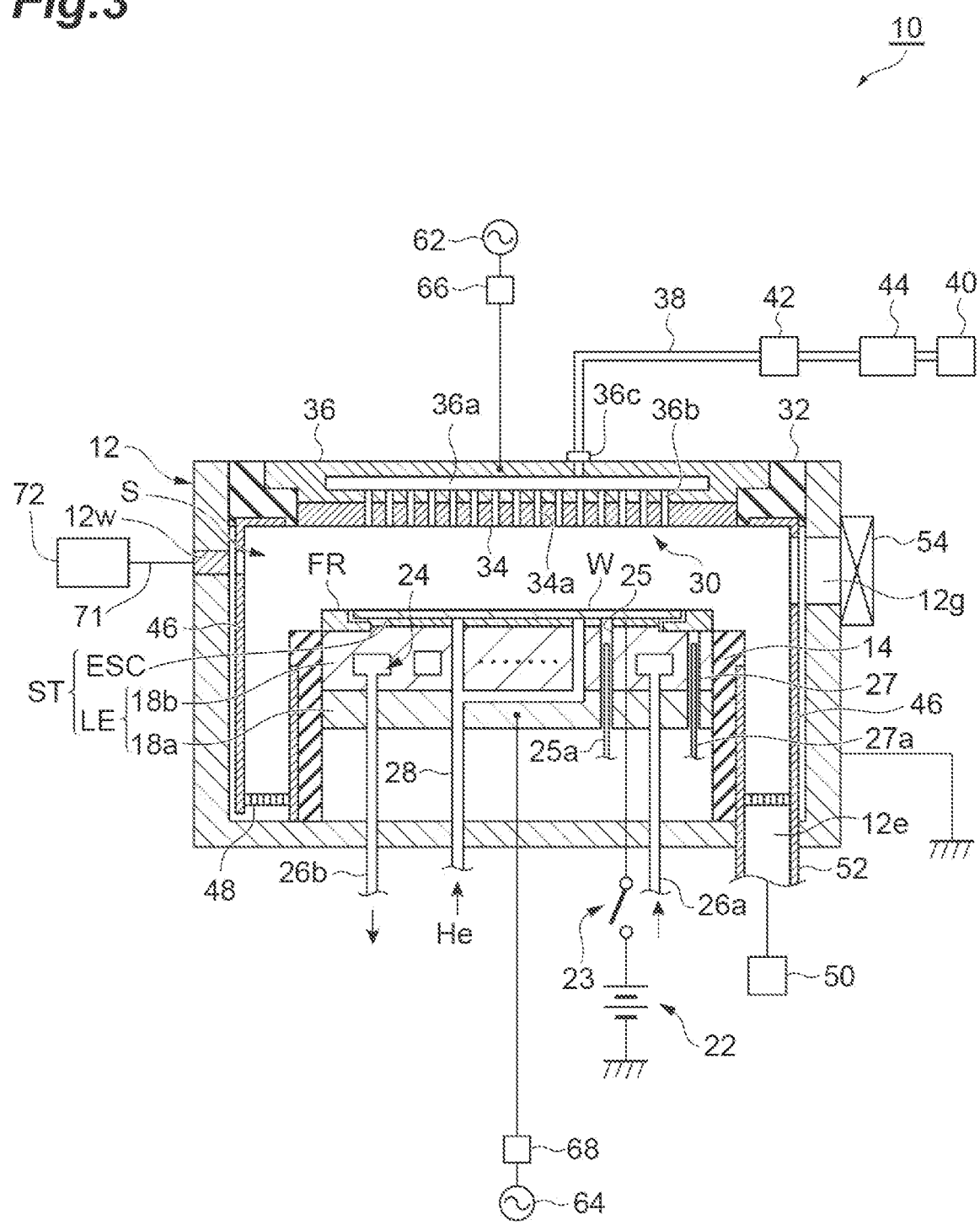
FIG. 3 is a diagram illustrating an example of a plasma processing device.

FIG. 3 is a diagram illustrating an example of a plasma processing device that can be adopted as any of the process modules PM1 to PM6. A plasma processing device 10 illustrated in FIG. 3 is a capacitance-coupling type plasma etching device. The plasma processing device 10 includes a chamber 12 having a substantially cylindrical shape. The chamber 12 is made of, for example, aluminum, and the inner wall surface thereof may be anodized. This chamber 12 is grounded for security.

A support portion 14 having a substantially cylindrical shape is provided on a bottom portion of the chamber 12. The support portion 14 is formed of, for example, an insulating material. The support portion 14 is provided in the chamber 12. The support portion 14 extends upward from the bottom portion of the chamber 12. In addition, a stage ST is provided in a chamber S provided by the chamber 12. The stage ST is supported by the support portion 14.

The stage ST includes a lower electrode LE and an electrostatic chuck ESC. The lower electrode LE includes a first plate 18a and a second plate 18b. The first plate 18a and the second plate 18b are formed of a metal such as aluminum, and have a substantially disk shape. The second plate 18b is provided on the first plate 18a and is electrically connected to the first plate 18a.

The electrostatic chuck ESC is provided on the second plate 18b. The electrostatic chuck ESC has a structure in which an electrode, which is a conductive film, is arranged between a pair of insulating layers or insulating sheets, and has a substantially disk shape. A DC power supply 22 is electrically connected to the electrode of the electrostatic chuck ESC via a switch 23. This electrostatic chuck ESC adsorbs the workpiece W by an electrostatic force such as a Coulomb force generated by a DC voltage from the DC power supply 22. In this way, the electrostatic chuck ESC can hold the workpiece W.

A focus ring FR is provided on a peripheral edge of the second plate 18b. This focus ring FR is provided to surround the edge of the workpiece W and the electrostatic chuck ESC. The focus ring FR can be formed from any of a variety of materials such as silicon, silicon carbide, and silicon oxide.

A refrigerant flow path 24 is provided inside the second plate 18b. The refrigerant flow path 24 configures a temperature control mechanism. Refrigerant is supplied to the refrigerant flow path 24 from a chiller unit provided outside the chamber 12 via a pipe 26a. The refrigerant supplied to the refrigerant flow path 24 is returned to the chiller unit via the pipe 26b. As described above, the refrigerant is circulated between the refrigerant flow path 24 and the chiller unit. The temperature of the workpiece W supported by the electrostatic chuck ESC is controlled by controlling the temperature of this refrigerant.

A plurality of (for example, three) through holes 25 penetrating the stage ST are formed in the stage ST. The plurality of through holes 25 are formed inside the electrostatic chuck ESC in a plan view. A lift pin 25a is inserted into each of these through holes 25. In FIG. 3, one through hole 25 into which one lift pin 25a is inserted is drawn. The lift pin 25a is provided to be vertically movable in the through hole 25. When the lift pin 25a rises, the workpiece W supported on the electrostatic chuck ESC rises.

In the stage ST, a plurality of (for example, three) through holes 27 penetrating the stage ST (lower electrode LE) are formed at a position outside the electrostatic chuck ESC in a plan view. The lift pin 27a is inserted into each of these through holes 27. In FIG. 3, one through hole 27 into which one lift pin 27a is inserted is drawn. The lift pin 27a is provided to be vertically movable in the through hole 27. When the lift pin 27a rises, the focus ring FR supported on the second plate 18b rises.

In addition, a gas supply line 28 is provided in the plasma processing device 10. The gas supply line 28 supplies heat transfer gas from a heat transfer gas supply mechanism such as He gas to a place between the upper surface of the electrostatic chuck ESC and the back surface of the workpiece W.

In addition, the plasma processing device 10 includes an upper electrode 30. The upper electrode 30 is arranged above the stage ST and facing the stage ST. The upper electrode 30 is supported on the upper portion of the chamber 12 via an insulating shielding member 32. The upper electrode 30 can include a top plate 34 and a support 36. The top plate 34 faces the chamber S. The top plate 34 is provided with a plurality of gas discharge holes 34a. The top plate 34 can be formed of silicon or quartz. Alternatively, the top plate 34 may be configured by forming a plasma resistant film such as yttrium oxide on the surface of the aluminum base material.

The support 36 detachably supports the top plate 34. The support 36 may be formed of a conductive material such as aluminum. The support 36 can have a water-cooled structure. A gas diffusion chamber 36a is provided inside the support 36. A plurality of gas flow holes 36b communicating with the gas discharge hole 34a is extended downward from this gas diffusion chamber 36a. In addition, a gas introduction port 36c for guiding the processing gas into the gas diffusion chamber 36a is formed in the support 36. A gas supply pipe 38 is connected to the gas introduction port 36c.

A gas source group 40 is connected to the gas supply pipe 38 via a valve group 42 and a flow rate controller group 44. The gas source group 40 includes a plurality of gas sources for a plurality of types of gases. The valve group 42 includes a plurality of valves and the flow rate controller group 44 includes a plurality of flow rate controllers such as mass flow controllers. The plurality of gas sources of the gas source group 40 are connected to the gas supply pipe 38 via the corresponding valve of the valve group 42 and the corresponding flow rate controller of the flow rate controller group 44, respectively.

In addition, in the plasma processing device 10, a depot shield 46 is detachably provided along the inner wall of the chamber 12. The depot shield 46 is also provided on the outer circumference of the support portion 14. The depot shield 46 prevents etching by-products (depots) from adhering to the chamber 12. The depot shield 46 can be configured by coating an aluminum material with ceramics such as yttrium oxide.

An exhaust plate 48 is provided on the bottom portion side of the chamber 12, and between the support portion 14 and the side wall of the chamber 12. The exhaust plate 48 can be configured, for example, by coating an aluminum material with ceramics such as yttrium oxide. In the exhaust plate 48, a plurality of holes penetrating in the thickness direction of the exhaust plate 48 are formed. An exhaust port 12e is provided below the exhaust plate 48 and on the chamber 12. An exhaust device 50 is connected to the exhaust port 12e via an exhaust pipe 52. The exhaust device 50 includes a vacuum pump such as a pressure regulating valve and a turbo molecular pump. The exhaust device 50 can reduce the pressure of the space in the chamber 12 to a desired degree of vacuum. In addition, the side wall of the chamber 12 is provided with a carry-inlet/outlet 12g for the workpiece W. The carry-inlet/outlet 12g can be opened and closed by a gate valve 54.

In addition, the plasma processing device 10 further includes a first high frequency power supply 62 and a second high frequency power supply 64. The first high frequency power supply 62 is a power supply that generates a first high frequency for the plasma generation. The first high frequency power supply 62 generates, for example, a high frequency having a frequency of 27 to 100 MHz. The first high frequency power supply 62 is connected to the upper electrode 30 via a matcher 66. The matcher 66 includes a circuit for matching an output impedance of the first high frequency power supply 62 with an input impedance of the load side (upper electrode 30 side). The first high frequency power supply 62 may be connected to the lower electrode LE via the matcher 66.

The second high frequency power supply 64 is a power supply that generates a second high frequency for drawing ions into the workpiece W. The second high frequency power supply 64 generates, for example, a high frequency with a frequency in the range of 400 kHz to 13.56 MHz. The second high frequency power supply 64 is connected to the lower electrode LE via a matcher 68. The matcher 68 includes a circuit for matching an output impedance of the second high frequency power supply 64 with an input impedance of the load side (lower electrode LE side).

In the plasma processing device 10, gas from one or more gas sources selected from the plurality of gas sources is supplied to the chamber S. In addition, the pressure in the chamber S is set to a predetermined pressure by the exhaust device 50. Further, the gas in the chamber S is excited by the first high frequency from the first high frequency power supply 62. As a result, the plasma is generated. Then, workpiece W is processed by the generated active species. If necessary, ions may be drawn into the workpiece W by a bias based on the second high frequency from the second high frequency power supply 64.

The chamber 12 is provided with a window 12w that transmits light. The window 12w may have, for example, a honeycomb-shaped double-glazed window structure. In this case, the plasma and radicals are suppressed from entering the window 12w, and the amount of reaction products adhering to the window 12w is reduced. An emission spectroscopic analyzer 72 is connected to the window 12w via a converging portion and an optical fiber 71. The emission spectroscopic analyzer 72 analyzes an emission intensity of the plasma generated in the chamber S. The emission spectroscopic analyzer 72 receives the light from the plasma through the window 12w. The emission spectroscopic analyzer 72 can operate in a maintenance mode in addition to the operation in a normal mode for analyzing the emission intensity of the plasma. In the maintenance mode, a spectroscope mounted on the emission spectroscopic analyzer 72 is calibrated with reference to a predetermined light source.

Next, the execution device will be described.

Figure 4:
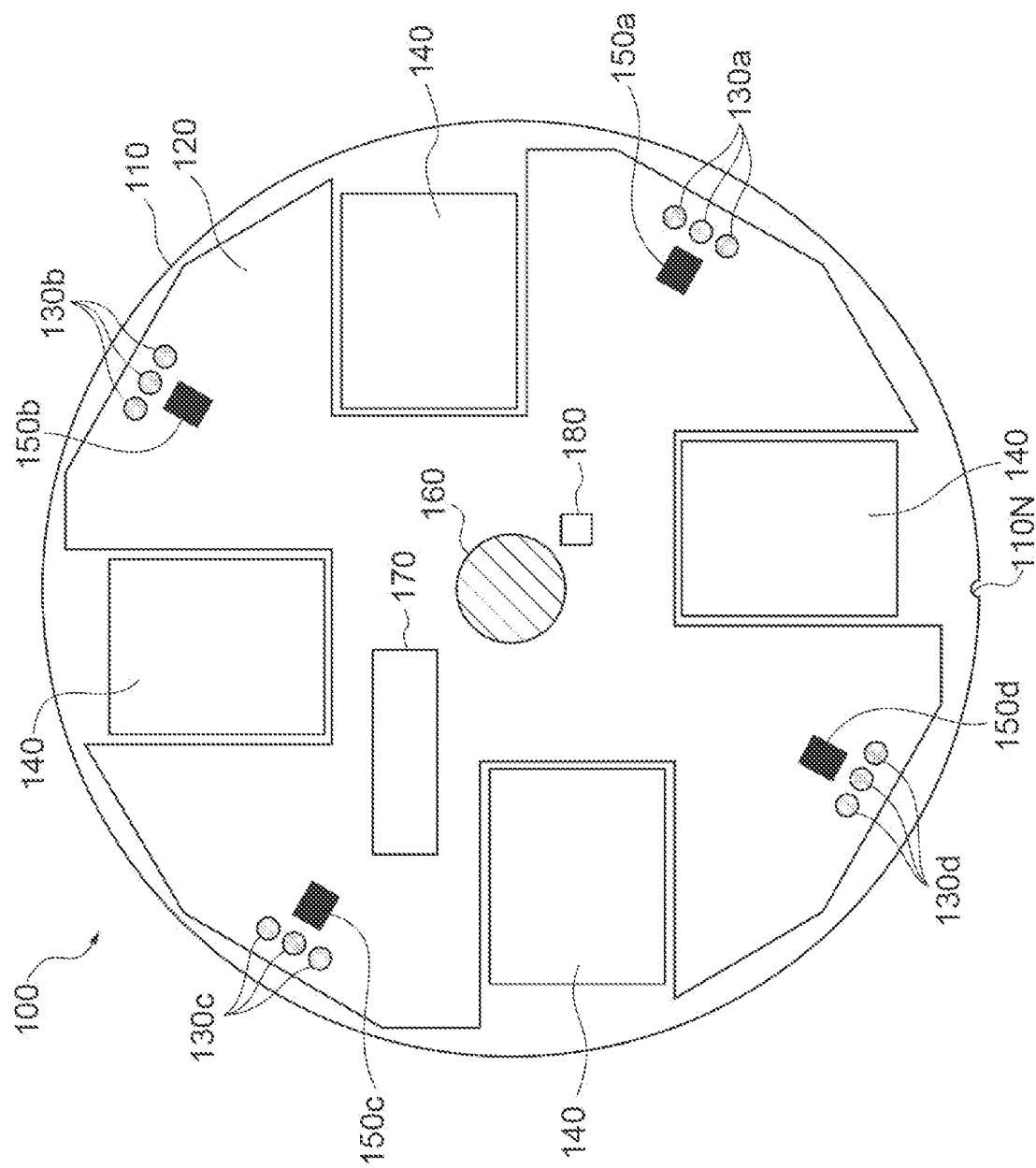
FIG. 4 is a cross-sectional schematic view of an example of an execution device.
Figure 5:
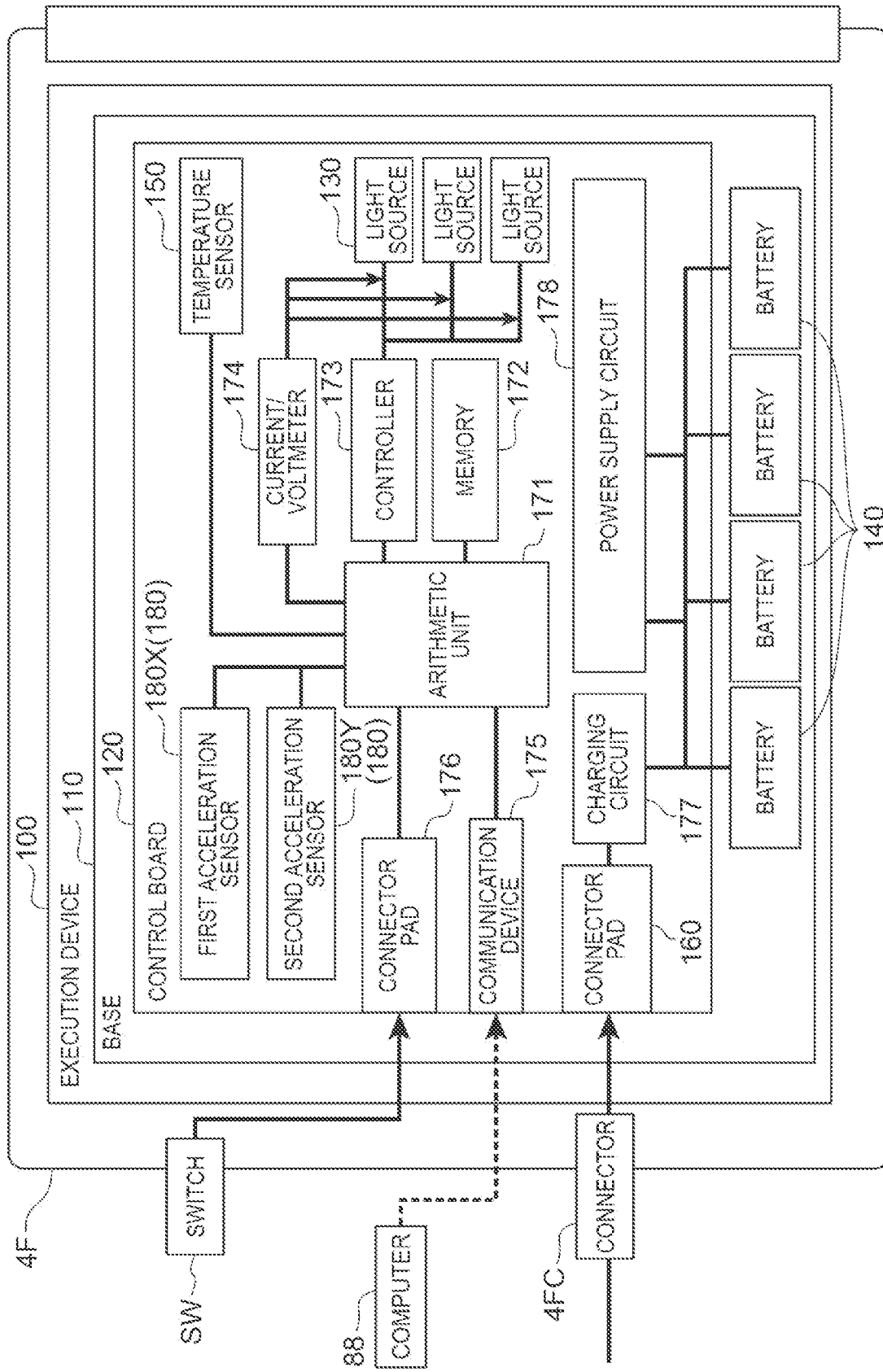
FIG. 5 is a block diagram illustrating an example the execution device.

FIG. 4 is a cross-sectional schematic view illustrating an example of the execution device 100 according to the embodiment. FIG. 5 is a block diagram illustrating the execution device. In FIG. 5, a dedicated FOUP 4F that is used when using the execution device 100 is also schematically illustrated. The execution device 100 includes a base 110, a control board 120, and a battery 140. The execution device 100 is transported by the transport device of the processing system 1 having a function as the semiconductor manufacturing apparatus S1, and executes the light emission from a plurality of light sources 130 (operation devices) as a predetermined operation.

The base 110 is a substrate using a disk-shaped wafer as an example. However, the base 110 is not limited to a disk shape, and is not limited to any shapes such as a polygon or an ellipse as long as it can be transported by the transport device that transports the substrate. A notch 110N is formed on the edge of the base 110. Examples of the material of the substrate include silicon, carbon fiber, quartz glass, silicon carbide, silicon nitride, alumina, and the like.

The control board 120 is a circuit board provided on the base 110. The control board 120 includes light sources 130a to 130d (collectively referred to as a "light source 130"), temperature sensors 150a to 150d (collectively referred to as a "temperature sensor 150"), a connector pad 160, a control circuit 170, and an acceleration sensor 180. The light sources 130a to 130d are arranged on the control board 120 on the base 110. The light source 130a, the light source 130b, the light source 130c, and the light source 130d emit light having wavelengths different from each other (that is, different colors). In the illustrated example, three light sources for each of the different wavelengths are arranged side by side along the outermost circumference of the base 110. However, the number of light sources 130 for each wavelength is not limited to three, and may be equal to or less than two or may be equal to or more than four. In addition, the arrangement position of the plurality of light sources 130a to 130d is not particularly limited as long as they are on the control board 120. The light source 130 may be a light emitting diode (LED) or an organic light emitting diode (OLED). The light source 130 is a reference light source in the maintenance mode of the emission spectroscopic analyzer 72. That is, the emission spectroscopic analyzer 72 operated in the maintenance mode is calibrated while the light source 130 emits the light in the process module PM.

The temperature sensors 150a to 150d are arranged in the vicinity of each light source so as to be one-to-one with respect to the light sources 130a to 130d. The temperature sensor 150a measures an ambient temperature of the light source 130a. The temperature sensor 150b measures an ambient temperature of the light source 130b. The temperature sensor 150c measures an ambient temperature of the light source 130c. The temperature sensor 150d measures an ambient temperature of the light source 130d.

The connector pad 160 is a connection portion for charging the battery. The connector pad 160 can be connected to an external power supply. The connector pad 160 is connected to the external power supply via the connector 4FC provided in the dedicated FOUP4F in a state of being placed in the dedicated FOUP4F. Four batteries 140 are arranged on the base 110. The battery 140 supplies the electric power to the light sources 130a to 130d and the control circuit 170. The number of batteries 140 is not limited to four as long as it can withstand the maximum current values of the light sources 130a to 130d. As illustrated in FIG. 5, a charging circuit 177 is connected between the connector pad 160 and the battery 140. The charging of the battery 140 is controlled by the charging circuit 177. In addition, a power supply circuit 178 is connected to the battery 140. The electric power from the battery 140 is supplied to each device via the power supply circuit 178.

The control circuit 170 is arranged on the control board 120. The control circuit 170 includes an arithmetic unit 171 including a processor, a memory 172, a controller 173, a current/voltmeter 174, and the like, and comprehensively controls the operation of the execution device 100 based on the program stored in the memory 172. The control circuit 170 functions as a controller that controls each portion of the execution device 100. For example, turning on and off the lighting of each of the light source 130 is controlled by the controller 173 in a state in which the power input to the light source 130 is measured by the current/voltmeter 174. In addition, a communication device 175 is connected to the control circuit 170 in order to control the communication with other external devices. In one example, information including a transport recipe described later can be input to the execution device 100 from an external computer 88 or the like via the communication device 175. Any of the wired or wireless method may be used as a method of connection between the communication device 175 and the computer 88. In addition, in one example, the execution device 100 includes a connector pad 176 connected to the control circuit 170. The connector pad 176 is connected to the switch SW provided on the dedicated FOUP 4F. The control circuit 170 may start controlling the execution device 100 based on the signal input from the switch SW.

The acceleration sensor 180 detects the transport operation of the execution device 100 in the processing system 1 by detecting the acceleration applied to the execution device 100. As illustrated in FIG. 5, the acceleration sensor 180 is configured to include at least a first acceleration sensor 180X and a second acceleration sensor 180Y.

Figure 6:
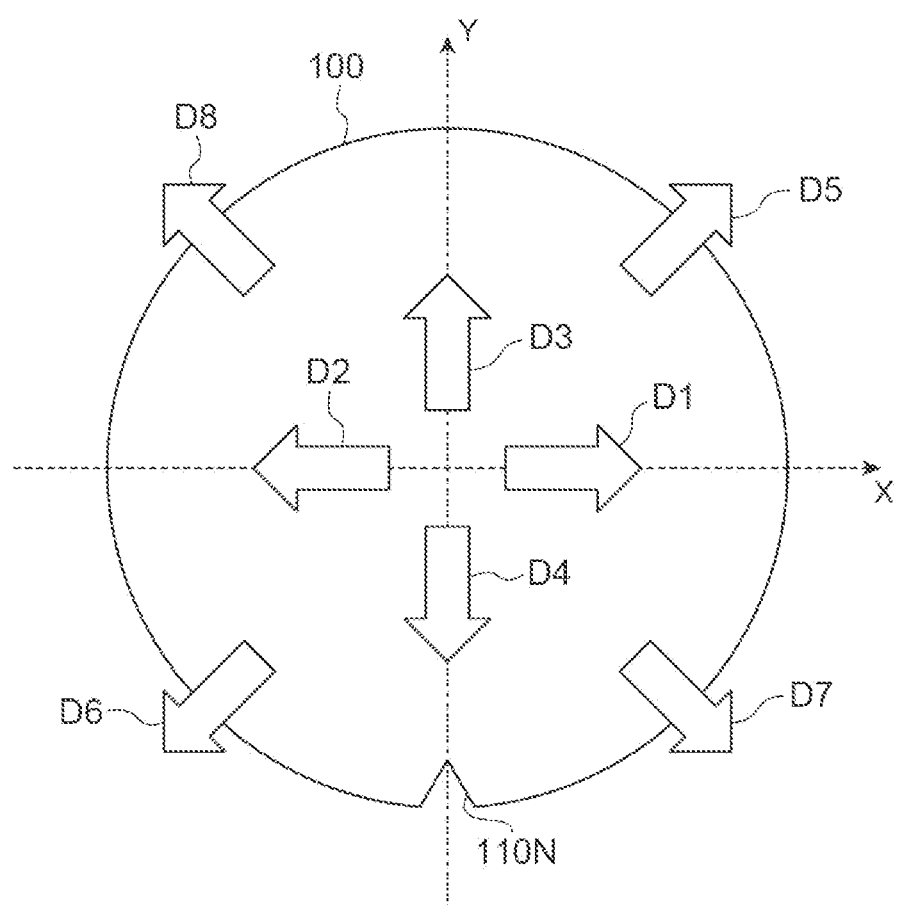
FIG. 6 is a schematic view for explaining an acceleration sensor of an example of the execution device.

FIG. 6 is a schematic view for explaining the acceleration sensor 180 of the execution device 100. In FIG. 6, a schematic plan view of the execution device 100 viewed from above is illustrated. The Y-axis in FIG. 6 passes through the center of the execution device 100 and the notch 110N. The X-axis is orthogonal to the Y-axis and passes through the center of the execution device 100. The X-axis and the Y-axis may be axes that are orthogonal (intersect) to each other along a plane along the control board 120.

The first acceleration sensor 180X is configured to detect the acceleration in the X-axis direction, and the second acceleration sensor 180Y is configured to detect the acceleration in the Y-axis direction. Therefore, when the execution device 100 is in a horizontal state, the acceleration in a first direction along the horizontal direction can be detected by the first acceleration sensor 180X. In addition, the acceleration in a second direction intersecting the first direction along the horizontal direction can be detected by the second acceleration sensor 180Y.

In one example, when the acceleration applied in the positive direction of the X-axis is detected, the first acceleration sensor 180X outputs a positive detection value according to the magnitude of acceleration, and when the acceleration applied in the negative direction of the X-axis is detected, outputs a negative detection value according to the magnitude of acceleration. In addition, when the acceleration applied in the positive direction of the Y-axis is detected, the second acceleration sensor 180Y outputs a positive detection value according to the magnitude of the acceleration, and when the acceleration applied in the negative direction of the Y-axis is detected, outputs a negative detection value according to the magnitude of acceleration.

In an example of the execution device 100, each of the detection values from the first acceleration sensor 180X and the second acceleration sensor 180Y is input to the arithmetic unit 171. The arithmetic unit 171 sums the detection value of the first acceleration sensor 180X and the detection value of the second acceleration sensor 180Y, and derives a total value. The arithmetic unit 171 counts the transport operations in the processing system 1 based on the total value.

When the execution device 100 is transported in the directions D1 and D2 along the X-axis illustrated in FIG. 6, the acceleration is substantially not detected by the second acceleration sensor 180Y. Therefore, the arithmetic unit 171 may set the detection value by only the first acceleration sensor 180X as the total value. Similarly, when the execution device 100 is transported in the directions D3 and D4 along the Y-axis illustrated in FIG. 6, the arithmetic unit 171 may set the detection value by only the second acceleration sensor 180Y as the total value. In addition, when the execution device is transported in the direction D5 which is the positive direction along both the X-axis and the Y-axis and the execution device is transported in the direction D6 which is the negative direction along both the X-axis and the Y-axis, the value obtained by adding the detection values may be used as the total value.

The direction D7 is the positive direction along the X-axis and the negative direction along the Y-axis. The direction D8 is the negative direction along the X-axis and the positive direction along the Y-axis. When the execution device 100 is transported in the direction D7 and the direction D8, the sign of the detection value by the first acceleration sensor 180X and the sign of the detection value by the second acceleration sensor 180Y are opposite to each other. Therefore, the value obtained by subtracting the detection value by the second acceleration sensor 180Y from the detection value by the first acceleration sensor 180X may be used as the total value. Since there is no problem as long as the detection value by the first acceleration sensor 180X and the detection value by the second acceleration sensor 180Y are not canceled by the summation, the value obtained by subtracting the detection value of the first acceleration sensor 180X from the detection value of the second acceleration sensor 180Y may be used as the total value.

As an example, when one of the two detection values input to the arithmetic unit 171 is substantially zero, the arithmetic unit 171 may determine that the execution device 100 is transported in the directions D1, D2, D3, and D4 to calculate the total value. In addition, when the signs of the two detection values input to the arithmetic unit 171 are the same, the arithmetic unit 171 may determine that the execution device 100 is transported in the directions D5 and D6 to calculate the total value. In addition, when the signs of the two detection values input to the arithmetic unit 171 are different from each other, the arithmetic unit 171 may determine that the execution device 100 is transported in the directions D7 and D8 to calculate the total value.

In the processing system 1, the execution device 100 is transported by the transport devices TU1 and TU2. For example, if the stopped execution device 100 is transported to a certain position by the transport device and then stopped, an acceleration is applied to the execution device 100 in the direction opposite to the transport direction at the start of the transport, and an acceleration is applied in the transport direction when the transport is stopped. Therefore, when the total value of the detection value by the first acceleration sensor 180X and the detection value of the second acceleration sensor 180Y exceeds a positive first threshold value and then falls below a negative second threshold value within a certain period of time, an example of the execution device 100 determines that one transport operation is executed. Furthermore, when the total value exceeds the positive second threshold value within a certain period of time after falling below the negative first threshold value, the execution device 100 determines that one transport operation is executed.

Figure 7:
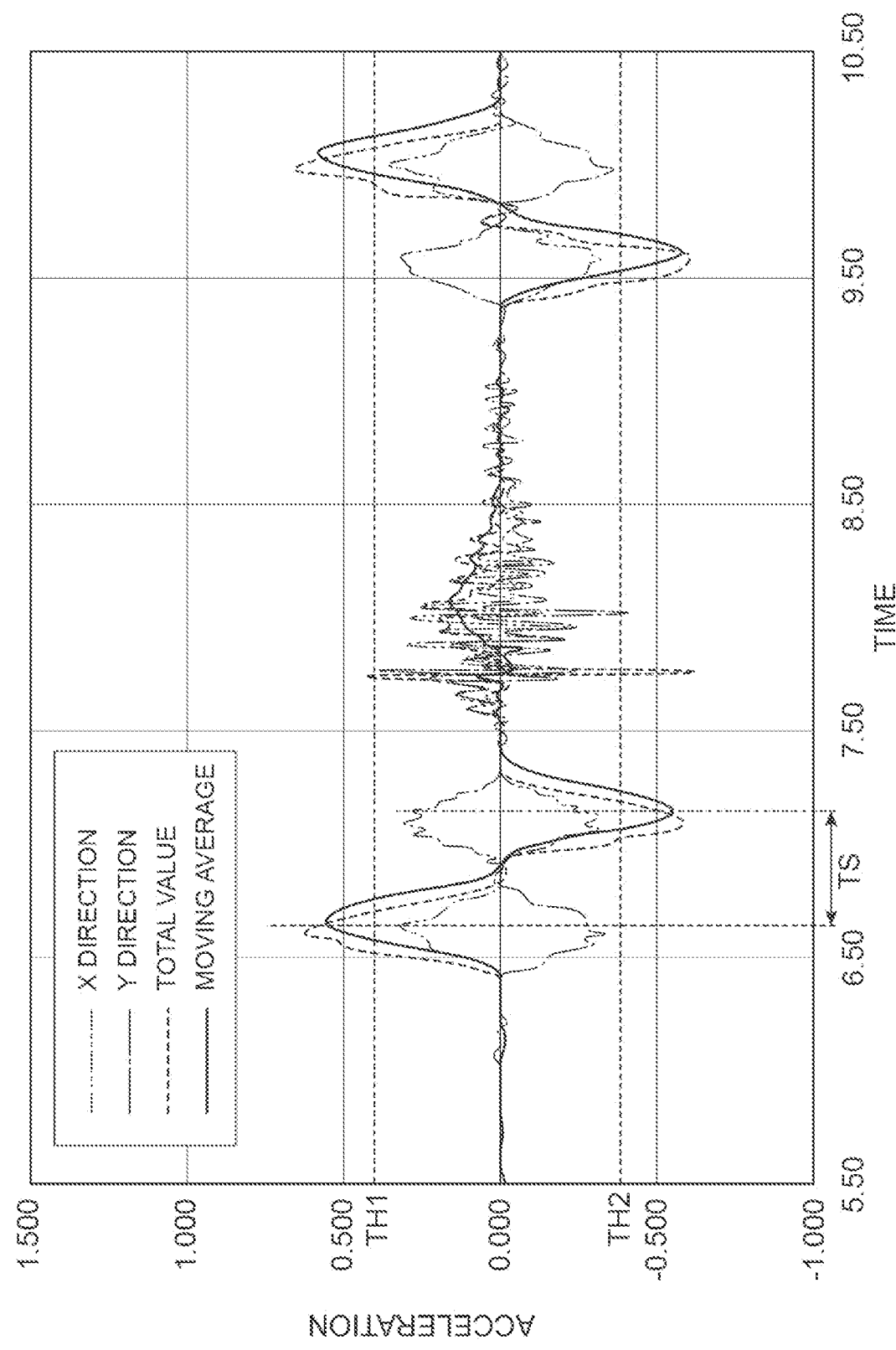
FIG. 7 is an example of a graph for explaining an acceleration applied to an example of the execution device.

FIG. 7 is an example of a graph for explaining the acceleration applied to the execution device. In FIG. 7, the detection value by the first acceleration sensor 180X is illustrated as an "X direction", and the detection value by the second acceleration sensor 180Y is illustrated as a "Y direction". The total value of the detection value by the first acceleration sensor 180X and the detection value by the second acceleration sensor 180Y is illustrated as a "total value". In FIG. 7, since the signs of the detection values in the X and Y directions are different from each other, the total value is a value obtained by subtracting the detection value in the Y direction from the detection value in the X direction. A "moving average" in the graph indicates a moving average of the total values. In FIG. 7, the acceleration when two transport operations are executed at a time interval. In this example, the detection value is disturbed because a rotation operation is added to the execution device 100 during the two transport operations. In order not to erroneously detect such disturbance of detection value, the presence or absence of the transport operation may be determined based on the moving average.

In the example of FIG. 7, the total value (here, the moving average) of the detection value by the first acceleration sensor 180X and the detection value by the second acceleration sensor 180Y exceeds the positive first threshold value TH1 and then falls below the negative second threshold value TH2 within a certain period of time TS. Therefore, the arithmetic unit 171 determines that the transport operation is executed. In addition, after that, since the total value falls below the negative threshold value TH2 and then exceeds the positive threshold value TH1 within a certain period of time, the arithmetic unit 171 determines that the second transport operation is executed.

Figure 8:
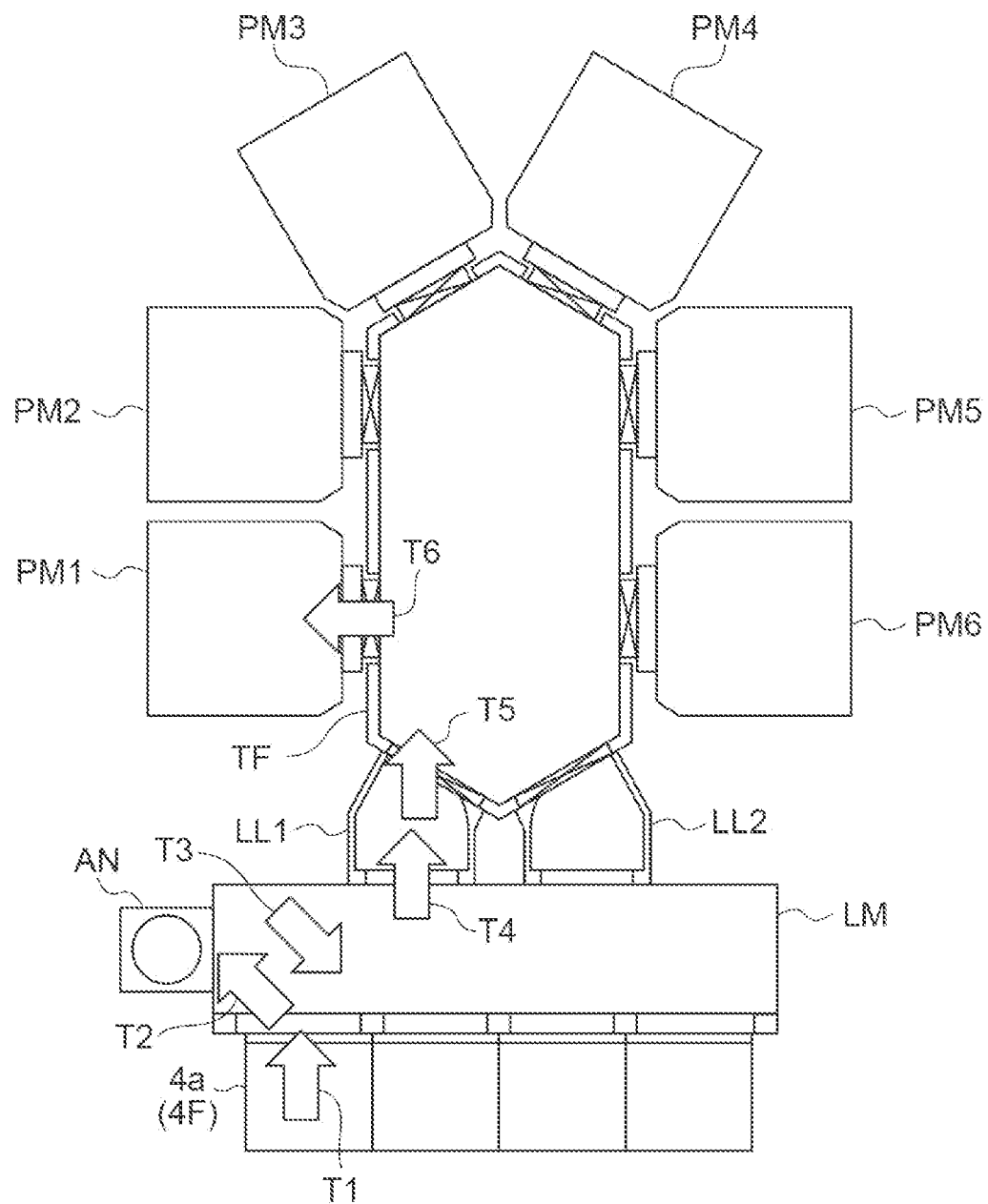
FIG. 8 is a diagram illustrating an example of a transport route of the execution device transported in the processing system.

FIG. 8 is a diagram illustrating an example of a transport route of the execution device transported in the processing system. When the execution device 100 is transported in an example of the processing system 1, the execution device 100 is transported to the target position by a plurality of transport operations. For example, a case where the execution device 100 is transported to the process module PM1 is considered. The execution device 100 is transported by a process including the transport operations T1 to T6. The transport operation T1 is an operation for taking out the workpiece from the container 4a (dedicated FOUP 4F). The transport operation T2 is an operation for transporting the workpiece from the take-out position from the container 4a to the aligner AN. The transport operation T3 is an operation for taking out the workpiece from the aligner AN. The transport operation T4 is an operation for transporting the workpiece from the take-out position from the aligner AN to the load lock module LL. The transport operation T5 is an operation for transporting the workpiece from the load lock module LL1 to the transfer module TF. The transport operation T6 is an operation for transporting the workpiece from the transfer module TF to the process module PML. In these transport operations T1 to T6, sometimes the state of acceleration applied to the execution device 100 may be different from each other. Therefore, in an example of the execution device 100, the transport operation is determined based on the transport recipe.

FIG. 9 is an example of a transport recipe used in an example of the execution device. A transport recipe R can indicate the relationship between information on the acceleration added to the execution device 100 transported to the transport device and information on the transport position. In the transport recipe R illustrated in FIG. 9, a required time, a maximum acceleration, a minimum acceleration, and the operation are associated with each other for each transport operation executed in order. The maximum acceleration corresponds to the positive threshold value TH1 for the total value (here, the moving average) of the detection value by the first acceleration sensor 180X and the detection value by the second acceleration sensor 180Y. The minimum acceleration corresponds to the negative threshold value TH2 for the total value. The required time is a time elapsed from the detection of the maximum value of the total value to the detection of the minimum value, or a time elapsed from the detection of the minimum value of the total value to the detection of the maximum value. That is, the required time corresponds to a time required from the start to the end of the transport, and is corresponding to a certain period of time TS. The required time, the maximum acceleration, and the minimum acceleration may be arbitrarily determined for each operation.

In the example in FIG. 9, a first to sixth operations correspond to the transport operation T1 to the transport operation T6, respectively. Therefore, for example, at a time point when it is determined by the arithmetic unit 171 that the second operation I executed, it can be recognized that the execution device 100 is positioned at the aligner AN. In addition, when it is determined that the first to sixth operations are completed, it can be recognized that the execution device 100 is placed in the process module PM1.

The arithmetic unit 171 causes the operation device to execute a predetermined operation when it is recognized that the execution device 100 is transported to a predetermined position. In an example, the arithmetic unit 171 may cause the light source 130 to emit the light when it is recognized that the execution device 100 is placed in the process module PM1.

Figure 10:
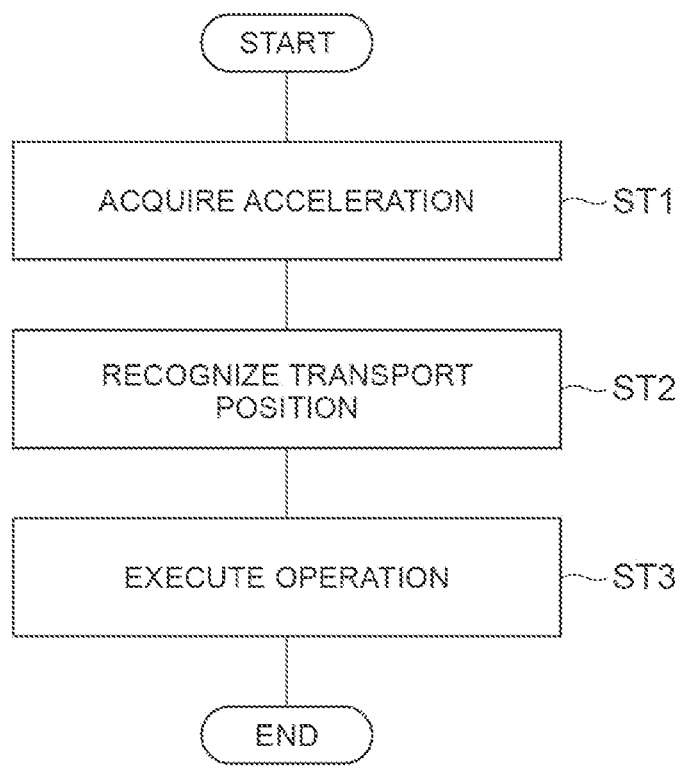
FIG. 10 is a flowchart illustrating an example of an operation method of the execution device.

Next, the operation of the execution device 100 will be described. FIG. 10 is a flowchart illustrating an example of an operation method of the execution device. When operating the execution device 100 as an example, first, the execution device 100 placed on the dedicated FOUP4F is activated. As described above, since the dedicated FOUP4F is provided with a switch SW for activating the execution device 100, the switch SW enables the execution device 100 to be activated. When the execution device 100 is activated, the signal from the acceleration sensor is acquired by the arithmetic unit 171 by the acceleration sensor 180 operates (step ST1). When calibrating the emission spectroscopic analyzer 72 using the execution device 100, the execution device 100 is started by the switch SW. At this time, the controller MC controls the processing system 1 such that the transport devices TU1 and TU2 transport the execution device 100 from the FOUP 4F to the process module PM. In addition, the controller MC controls the emission spectroscopic analyzer 72 to operate in maintenance mode.

The arithmetic unit 171 derives the total value of acceleration based on the acquired detection value, and recognizes the transport position of the execution device 100 by analyzing the derived total value with reference to the transport recipe R (step ST2). The recognition of the transport position has the same meaning as a determination that the operation is completed up to which position in the transport recipe R.

When it is recognized that execution device 100 is transported to a predetermined position, the arithmetic unit 171 causes the operation device to execute a predetermined operation (step ST3). In one example, when it is recognized that the execution device 100 is transported to the process module PM1, the arithmetic unit 171 controls the controller 173 such that the light source 130 emits the light. When the emission spectroscopic analyzer 72 is waiting in the maintenance mode by the controller MC, the emission spectroscopic analyzer 72 is calibrated when the light source 130 emits the light. When a predetermined time elapsed since the light source 130 emits the light, the arithmetic unit 171 may determine that the calibration of the emission spectroscopic analyzer 72 is completed, and may stop the light source 130 from emitting the light. Depending on the calibration program of the emission spectroscopic analyzer 72, the execution device 100 may be transported between the process module PM and the aligner AN multiple times. The arithmetic unit 171 may cause the light source 130 to emit the light each time it is determined that the execution device 100 is transported to the process module PM1. In this case, the transport recipe may include a recipe corresponding to the transport operation between the process module PM and the aligner AN in addition to the operation of transportation from the FOUP 4F to the process module PM. Furthermore, the transport recipe may include a light emission control procedure by the light source 130 as a recipe for the predetermined operation in addition to the transport operation recipe. In this case, the arithmetic unit 171 can control the light source 130 with reference to the transport recipe. When the calibration of the emission spectroscopic analyzer 72 is completed, the execution device 100 is transported to the FOUP 4F by the transport devices TU1 and TU2.

In the process module PM, the execution device 100 cannot be controlled wirelessly. However, when calibrating the emission spectroscopic analyzer 72 using the light source 130, it is not always preferable in terms of operation to make the light source 130 emit light even during the transport operation. In the execution device 100 described above, the horizontal acceleration applied to the execution device 100 is detected by the first acceleration sensor 180X and the second acceleration sensor 180Y provided in the execution device 100. Therefore, the transport position of the execution device 100 can be recognized by specifying the transport state of the execution device 100 based on the output values from the first acceleration sensor 180X and the second acceleration sensor 180Y. That is, the execution device 100 functions as a position determination device that determines the transport position during the transportation. When it is recognized that the execution device 100 is transported to a predetermined position, by controlling the operation device (the light source 130 in an example) to execute a predetermined operation, the predetermined operation can be automatically executed at a desired position.

In an exemplary embodiment, the arithmetic unit 171 (the control device) stores a transport recipe (recipe information) R indicating the relationship between the information on the acceleration added to the execution device 100 transported to the transport device and the information on the transport position. The arithmetic unit 171 can recognize the transport position from the acceleration derived based on the output values from the first acceleration sensor 180X and the second acceleration sensor 180Y with reference to the transport recipe R. Since the arithmetic unit 171 stores the transport recipe R in advance, it is possible to accurately recognize the transport position even when a complicated transport operation is executed.

In an exemplary embodiment, the operation device may include a plurality of light sources 130 that emit the light having wavelengths different from each other, and the predetermined operation may be the light emission from the plurality of light sources 130. In this calibration, the calibration work of the emission spectroscopic analyzer 72 in the processing system 1 can be accurately performed.

Although various exemplary embodiments are described above, without being limited to the exemplary embodiments described above, various omissions, substitutions, and changes may be made.

For example, the execution device 100 may further include a third acceleration sensor that detects acceleration in the Z-axis direction orthogonal to both the X-axis and the Y-axis.

The light source 130 emits the light when the execution device 100 is transported to the process module PM, but the present invention is not limited thereto. The position where the execution device 100 is transported and the content of the control executed at the position may be arbitrarily determined. For example, the position where the predetermined operation is executed may be the loader module LM, the aligner AN, the load lock modules LL1 and LL2, the transfer module TF, or the like. In addition, the execution device may include a measuring instrument for measuring the electrostatic capacitance between the execution device and the object, an imaging device for imaging the surroundings of the execution device, as the operation devices that execute predetermined operations.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An execution device that is transported to a transport device provided in a semiconductor manufacturing apparatus and executes a predetermined operation, the semiconductor apparatus comprising:
   a loader module for conveying a workpiece, the loader module providing a transport space under atmospheric pressure,
   an aligner that is connected to the loader module, and adjusts the position of the workpiece around a circumferential direction,
   a load lock module that is connected to the loader module, and defines a preliminary decompression chamber,
   a transfer module that is connected to the load lock module, and defines a decompression chamber, and
   process modules that are connected to the transfer module, and each perform plasma processing on the workpiece, and
   the device comprising:
   an operation device for executing the predetermined operation;
   a first acceleration sensor that can detect acceleration in a first direction along a horizontal direction;
   a second acceleration sensor that can detect acceleration in a second direction intersecting the first direction along the horizontal direction; and
   a controller that recognizes a transport position of the execution device in the semiconductor manufacturing apparatus based on output values from the first acceleration sensor and the second acceleration sensor, and when it is recognized that the execution device is transported to a predetermined position, causes the operation device to execute the predetermined operation, wherein
the controller stores recipe information indicating a relationship between information on the acceleration applied to the execution device transported to the transport device and information on the transport position, and recognizes the transport position from the acceleration derived based on the output values from the first acceleration sensor and the second acceleration sensor with reference to the recipe information,
the operation device is at least one of
- a plurality of light sources that emit light having wavelengths different from each other, the predetermined operation being a light emission from the plurality of light sources,
- a measuring instrument for measuring electrostatic capacitance, the predetermined operation being a measurement of electrostatic capacitance between the execution device and an object, and
- an imaging device, the predetermined operation being imaging surroundings of the execution device, and the predetermined position is a position of any one of the process modules, the loader module, the aligner, the load lock module and the transfer module.

2. An execution method for causing an execution device transported to a transport device provided in a semiconductor manufacturing apparatus to execute a predetermined operation, the semiconductor apparatus comprising:
a loader module for conveying a workpiece, the loader module providing a transport space under atmospheric pressure,
an aligner that is connected to the loader module, and adjusts the position of the workpiece around a circumferential direction,
a load lock module that is connected to the loader module, and defines a preliminary decompression chamber,
a transfer module that is connected to the load lock module, and defines a decompression chamber, and
process modules that are connected to the transfer module, and each perform plasma processing on the workpiece, and
the method comprising:
acquiring acceleration of the execution device in a first direction along a horizontal direction and a second direction intersecting the first direction along the horizontal direction;
recognizing a transport position of the execution device in the semiconductor manufacturing apparatus based on the acceleration, the recognizing of the transport position including referring to recipe information indicating a relationship between information on the acceleration applied to the execution device transported to the transport device and information on the transport position, and
causing the execution device to execute the predetermined operation when it is recognized that the execution device is transported to a predetermined position,
wherein
the causing the execution device to execute the predetermined operation is at least one of
emitting light having wavelengths different from each other by a plurality of light sources,
measuring electrostatic capacitance between the execution device and an object, and
imaging surroundings of the execution device, and
the predetermined position is a position of any one of the process modules, the loader module, the aligner, the load lock module and the transfer module.

3. The execution device according to claim 1, wherein the operation device is the plurality of light sources that emit light having wavelengths different from each other, the predetermined operation being a light emission from the plurality of light sources.

4. The execution device according to claim 1, wherein the operation device is the measuring instrument for measuring electrostatic capacitance, the predetermined operation being a measurement of electrostatic capacitance between the execution device and an object.

5. The execution device according to claim 1, wherein the operation device is the imaging device, the predetermined operation being imaging surroundings of the execution device.

6. The execution device according to claim 1, wherein the predetermined position is a position of any one of the process modules.

7. The execution device according to claim 1, wherein the predetermined position is a position of the aligner.

8. The execution device according to claim 1, wherein the predetermined position is a position of the load lock module.

9. The execution device according to claim 1, wherein the predetermined position is a position of the transfer module.

10. The execution method according to claim 2, wherein the causing the execution device to execute the predetermined operation is emitting light having wavelengths different from each other by a plurality of light sources.

11. The execution method according to claim 2, wherein the causing the execution device to execute the predetermined operation is measuring electrostatic capacitance between the execution device and an object.

12. The execution method according to claim 2, wherein the causing the execution device to execute the predetermined operation is imaging surroundings of the execution device.

13. The execution method according to claim 2, wherein the predetermined position is a position of any one of the process modules.

14. The execution method according to claim 2, wherein the predetermined position is a position of the aligner.

15. The execution method according to claim 2, wherein the predetermined position is a position of the load lock module.

16. The execution method according to claim 2, wherein the predetermined position is a position of the transfer module.

* * * * *